United States Patent
Wang et al.

(10) Patent No.: US 10,077,382 B1
(45) Date of Patent: Sep. 18, 2018

(54) METHOD FOR POLISHING COBALT-CONTAINING SUBSTRATE

(71) Applicant: Rohm and Haas Electronic Materials CMP Holdings, Inc., Newark, DE (US)

(72) Inventors: Hongyu Wang, Wilmington, DE (US); Murali G. Theivanayagam, New Castle, DE (US)

(73) Assignee: Rohm and Haas Electronic Materials CMP Holdings, Inc., Newark, DE (US)

(*) Notice: Subject to any disclaimer, the term of this patent is extended or adjusted under 35 U.S.C. 154(b) by 15 days.

(21) Appl. No.: 15/450,170

(22) Filed: Mar. 6, 2017

(51) Int. Cl.

| | |
|---|---|
| H01L 21/302 | (2006.01) |
| H01L 21/461 | (2006.01) |
| C03C 15/00 | (2006.01) |
| C03C 25/68 | (2006.01) |
| C25F 3/00 | (2006.01) |
| C09G 1/02 | (2006.01) |
| C09K 3/14 | (2006.01) |
| H01L 21/306 | (2006.01) |
| C09G 1/04 | (2006.01) |
| C23C 16/02 | (2006.01) |
| H01L 21/321 | (2006.01) |
| C09G 1/00 | (2006.01) |

(52) U.S. Cl.
CPC ........... C09G 1/02 (2013.01); C09G 1/00 (2013.01); C09G 1/04 (2013.01); C09K 3/1409 (2013.01); C23C 16/0254 (2013.01); H01L 21/30625 (2013.01); H01L 21/3212 (2013.01)

(58) Field of Classification Search
None
See application file for complete search history.

(56) References Cited

U.S. PATENT DOCUMENTS

| | | | |
|---|---|---|---|
| 8,980,750 B2 | 3/2015 | Reichardt et al. | |
| 9,528,030 B1 | 12/2016 | Kraft et al. | |
| 2006/0219663 A1* | 10/2006 | Wang | C09G 1/02 |
| | | | 216/88 |
| 2013/0140273 A1 | 6/2013 | Lu et al. | |
| 2013/0186850 A1* | 7/2013 | Wang | C09K 3/1463 |
| | | | 216/13 |
| 2014/0243250 A1 | 8/2014 | Miller et al. | |
| 2015/0291850 A1* | 10/2015 | Tamai | C09G 1/02 |
| | | | 252/79.5 |
| 2016/0027657 A1* | 1/2016 | Shi | H01L 21/31111 |
| | | | 438/693 |
| 2016/0068710 A1 | 3/2016 | Wang et al. | |
| 2016/0107289 A1 | 4/2016 | Cavanaugh et al. | |
| 2016/0108285 A1 | 4/2016 | Kraft et al. | |
| 2016/0108286 A1 | 4/2016 | Sikma et al. | |
| 2016/0115353 A1 | 4/2016 | Kraft et al. | |
| 2016/0189976 A1 | 6/2016 | Wang et al. | |

FOREIGN PATENT DOCUMENTS

| | | |
|---|---|---|
| WO | 2016/008896 A1 | 1/2016 |
| WO | 2016/102279 A1 | 6/2016 |
| WO | 2017/025536 A1 | 2/2017 |

OTHER PUBLICATIONS

Copending U.S. Appl. No. 15/450,139.

* cited by examiner

*Primary Examiner* — Stephanie P. Duclair
(74) *Attorney, Agent, or Firm* — Blake T. Biederman

(57) ABSTRACT

The invention is a method for chemical mechanical polishing a semiconductor substrate having cobalt or cobalt alloy containing features containing $Co^0$. The method mixes 0.1 to 2 wt % hydrogen peroxide oxidizing agent ($\alpha$) into a slurry containing 0.5 to 3 wt % colloidal silica particles ($\beta$), the colloidal silica particles containing primary particles, 0.5 to 2 wt % complexing agent ($\gamma$) selected from at least one of L-aspartic acid, nitrilotriacetic acid, nitrilotri(methylphosphonic acid), ethylenediamine-N,N'-disuccinic acid trisodium salt, and ethylene glycol-bis (2aminoethylether)-N,N,N',N'-tetraacetic acid, and balance water having a pH of 5 to 9 to create a polishing slurry for the semiconductor substrate. Oxidizing at least a surface portion of the $Co^0$ to $Co^{+3}$ of the semiconductor substrate to prevent runaway dissolution of the $Co^0$ reduces polishing defects in the semiconductor substrate. Polishing the semiconductor substrate with a polishing pad removes the surface portion of the semiconductor substrate oxidized to $Co^{+3}$.

8 Claims, No Drawings

METHOD FOR POLISHING COBALT-CONTAINING SUBSTRATE

BACKGROUND OF THE INVENTION

Typically, semiconductor substrates have a silicon base and dielectric layers containing multiple trenches arranged to form a pattern of circuit interconnects within the dielectric layer. These trench patterns have either a damascene structure or dual damascene structure. In addition, typically one to as many as three or more capping layers coat the trench patterned dielectric layer with a barrier layer covering the capping layer or capping layers. Finally, a metal layer covers the barrier layer and fills the patterned trenches. The metal layer forms circuit interconnects that connect dielectric regions and form an integrated circuit. Typically, these circuits contain copper for horizontal interconnections and tungsten for vertical interconnections.

For the advanced technical nodes with line widths of 10 nm and below, cobalt-containing films are being implemented on top of Ti/TiN or Ta/TaN barrier layers for the first metal interconnects. These cobalt-containing interconnects have a high depth to width aspect ratios that renders copper seed and subsequent copper electrodeposition. This enables a much thinner copper seed layer deposition, which improves the trench Cu electroplating process and avoid void formation. In addition, cobalt can replace copper and form entire interconnects for the first metal interconnects. Finally, cobalt can replace tungsten for trenches that connect multiple transistors. All these new processes require CMP to achieve planarity to the desired targeted thickness, dishing, defectivity and selectivities.

For slurries that involve in these processes, they need to have special chemistries to handle the peculiarities of cobalt films. First, cobalt is prone to oxidation and corrosion, as it is an active metal. Cobalt's reduction potential (−0.28 V vs. SHE) makes it an easy corrosion target when in contact with other nobler metals such as copper (+0.34 V SHE). Since first layer interconnects contain cobalt in combination with the more noble copper, galvanic corrosion is of particular concern during cobalt polishing of this layer. Second, corrosion defects and the resulting metal roughness after CMP are major challenges in developing successful cobalt CMP slurry.

There is a demand for a polishing method that can polish cobalt in multiple films without excessive corrosion. Furthermore, there is a demand for a cobalt method that can polish cobalt into a planar surface with little surface roughness.

STATEMENT OF THE INVENTION

The invention provides a method for chemical mechanical polishing a semiconductor substrate having cobalt or cobalt alloy containing features containing $Co^0$ comprising the steps of: mixing 0.1 to 2 wt % hydrogen peroxide oxidizing agent ($\alpha$) into a slurry containing 0.5 to 3 wt % colloidal silica particles ($\beta$), the colloidal silica particles containing primary particles, the primary particles having an average diameter of 25 to 50 nm and linked together in conjoined spherical structures, the conjoined spherical structures having an average length of 40 to 80 nm, a cobalt corrosion inhibitor, 0.5 to 2 wt % complexing agent ($\gamma$) selected from at least one of L-aspartic acid, nitrilotriacetic acid, nitrilotri (methylphosphonic acid), ethylenediamine-N,N'-disuccinic acid trisodium salt, and ethylene glycol-bis (2aminoethylether)-N,N,N',N'-tetraacetic acid, and balance water having a pH of 5 to 9 and wherein the total concentrations remain within the following formulae as follows: wt % ($\alpha$)+wt % ($\beta$)=1 to 4 wt % for polishing the cobalt or cobalt alloy; wt % ($\gamma$)≤2*wt % ($\alpha$) for limiting static etch of the cobalt or cobalt alloy; and wt % ($\beta$)+wt % ($\gamma$)≤3*wt % ($\alpha$) for limiting static etch of the cobalt or cobalt alloy; and wherein slope of cobalt removal rate (Å/min) is from 0 to −1050 for a cobalt blanket wafer when increasing the hydrogen peroxide ($\alpha$) from 0.4 to 1.0 wt % when polishing with a polyurethane polishing pad having a Shore D hardness of 57, closed cell pores with an average diameter between 30 and 60 μm and circular grooves having a depth, width and pitch of 760, 510 and 3,050 μm, respectively at a downforce of 2 psi (13.8 kPa), 93 rpm platen speed, 87 rpm carrier speed with a slurry at 200 ml/min having 35 nm or 80 nm average diameter colloidal silica particles when using a diamond conditioner at a polish time of 10 to 60 seconds; oxidizing at least a surface portion of the $Co^0$ to $Co^{+3}$ of the semiconductor substrate to prevent runaway dissolution of the $Co^0$ and to reduce polishing defects; and polishing the semiconductor substrate with a polishing pad to remove the surface portion of the semiconductor substrate oxidized to $Co^{+3}$.

An alternative embodiment of the invention provides a method for chemical mechanical polishing a semiconductor substrate having cobalt or cobalt alloy containing features containing $Co^0$ comprising the steps of: mixing 0.5 to 1.5 wt % hydrogen peroxide oxidizing agent ($\alpha$) into a slurry containing 0.75 to 2 wt % colloidal silica particles ($\beta$), the colloidal silica particles containing primary particles, the primary particles having an average diameter of 25 to 50 nm and linked together in conjoined spherical structures, the conjoined spherical structures having an average length of 40 to 80 nm, a cobalt corrosion inhibitor, 0.75 to 1.5 wt % complexing agent ($\gamma$) selected from at least one of L-aspartic acid, nitrilotriacetic acid, nitrilotri(methylphosphonic acid), ethylenediamine-N,N'-disuccinic acid trisodium salt, and ethylene glycol-bis (2aminoethylether)-N,N,N',N'-tetraacetic acid, and balance water having a pH of 5 to 9 and wherein the total concentrations remain within the following formulae as follows: wt % ($\alpha$)+wt % ($\beta$)=1.5 to 3 wt % for polishing the cobalt or cobalt alloy; wt % ($\gamma$)≤1.5*wt % ($\alpha$) for limiting static etch of the cobalt or cobalt alloy; and wt % ($\beta$)+wt % ($\gamma$)≤2.5*wt % ($\alpha$) for limiting static etch of the cobalt or cobalt alloy; and wherein slope of cobalt removal rate (Å/min) is from 0 to −1050 for a cobalt blanket wafer when increasing the hydrogen peroxide ($\alpha$) from 0.4 to 1.0 wt % when polishing with a polyurethane polishing pad having a Shore D hardness of 57, closed cell pores with an average diameter between 30 and 60 μm and circular grooves having a depth, width and pitch of 760, 510 and 3,050 μm, respectively at a downforce of 2 psi (13.8 kPa), 93 rpm platen speed, 87 rpm carrier speed with a slurry at 200 ml/min having 35 nm or 80 nm average diameter colloidal silica particles when using a diamond conditioner at a polish time of 10 to 60 seconds; oxidizing at least a surface portion of the $Co^0$ to $Co^{+3}$ of the semiconductor substrate to prevent runaway dissolution of the $Co^0$ and to reduce polishing defects; and polishing the semiconductor substrate with a polishing pad to remove the surface portion of the semiconductor substrate oxidized to $Co^{+3}$.

DETAILED DESCRIPTION

It has been discovered that an increased combination of oxidizer and abrasive can lower defects in relation to a low-abrasive formulation. This is counterintuitive to the general proposition that slurry particles tend to increase polishing defects such as imbedded particles, organic deposits and scratching. It has been discovered that complete oxidation of at least a portion of the $Co^0$ to $Co^{+3}$ decreases defects in relation to slurries driven primarily by complexing $Co^{+2}$ formed at the surface. For purposes of this specification, $Co^0$ refers to cobalt metal with incidental impurities or a cobalt-base alloy capable of conducting electrons and cobalt alloy refers to a cobalt mixture having a majority cobalt by weight percent.

The slurry contains sufficient oxidizer to convert $Co^0$ to $Co^{+3}$ at a portion of the semiconductor substrate exposed to the slurry. In addition to oxidizing the metal valence to a cation, it typically coverts the cobalt into an oxide film. This conversion may be a blend of $Co^{+2}$ and $Co^{+3}$ such as $Co_3O_4$ or complete to $Co^{+3}$ in the form of $Co_2O_3$. Alternatively, the cobalt may also form hydroxide compounds, mixed oxide-hydroxide compounds and cobalt chelator complexes.

Hydrogen peroxide represents the preferred oxidizer for slurries of the invention. Because hydrogen peroxide decomposes over time, it is advantageous for the end user to add the hydrogen peroxide shortly before use. Preferably, the slurry contains 0.1 to 2 wt % hydrogen peroxide oxidizing agent. Most preferably, the slurry contains 0.5 to 1.5 wt % hydrogen peroxide oxidizing agent. This specification refers to all ingredients in weight percent, unless specifically noted otherwise.

Colloidal silica facilitates cobalt removal through mechanical means. Preferably, 0.5 to 3.0 wt % colloidal silica particles facilitate cobalt removal. Most preferably, 0.75 to 2 wt % colloidal silica particles facilitate cobalt removal. The colloidal silica are a structure containing primary particles. The primary particles have an average diameter of 25 to 50 nm that are linked together into conjoined spherical structures. The conjoined spherical structures have an average length of 40 to 80 nm. Most advantageously, the primary particles have an average diameter of 35 nm and the conjoined spheres have an average length of 70 nm. The conjoined spherical structure allows efficient removal of cobalt structures not feasible with conventional or spherical colloidal silica particles.

In addition to the oxidation of the cobalt, an inhibitor prevents runaway corrosion of the cobalt and decreasing static etch. Example inhibitors include nitrogen containing heterocycle inhibitors, such as benzotriazole, adenine, 1,2, 4-triazole, imidazole, and polyimidazole or a combination of these. Preferably, the slurry includes 20 ppm to 2.2 wt % inhibitor. Most preferably, the slurry includes 20 ppm to 0.8 wt % inhibitor. Preferably, the inhibitor is either benzotriazole, a mixture of benzotriazole and polyamidazole or a mixture of benzotriazole and adenine. Most preferably, the inhibitor is benzotriazole.

A complexing agent accelerates the removal of cobalt from the semiconductor substrate. Preferably, the complexing agent is selected from at least one of L-aspartic acid, nitrilotriacetic acid, nitrilotri(methylphosphonic acid), ethylenediamine-N,N'-disuccinic acid trisodium salt, and ethylene glycol-bis (2aminoethylether)-N,N,N',N'-tetraacetic acid. Most preferably, the complexing agent is L-aspartic acid. L-aspartic acid has the advantage of limited rate decay when hydrogen peroxide concentration increases from 0.4 to 1.0 wt %, when using at least 1 wt % abrasives in the formulation at pH 8. The slope of cobalt removal rate (Å/min) is from 0 to −1050 for a cobalt blanket wafer when increasing the hydrogen peroxide ($\alpha$) from 0.4 to 1.0 wt % when polishing with a polyurethane polishing pad having a Shore D hardness of 57, closed cell pores with an average diameter between 30 and 60 μm and circular grooves having a depth, width and pitch of 760, 510 and 3,050 μm, respectively at a downforce of 2 psi (13.8 kPa), 93 rpm platen speed, 87 rpm carrier speed with a slurry at 200 ml/min having 20 μm or 80 μm average diameter colloidal silica particles when using a diamond conditioner at a polish time of 10 to 60 seconds. Preferably, these polishing conditions provide a cobalt removal rate of at least 1000 Å/min at a hydrogen peroxide concentration of 1.0 wt %. Most preferably, these polishing conditions provide a cobalt removal rate of at least 2000 Å/min at a hydrogen peroxide concentration of 1.0 wt %.

Preferably the concentration of complexing agent is 0.5 to 2 wt %. Most preferably, the complexing agent concentration is 0.75 to 1.5 wt %. It is critical to balance the oxidizer, complexing agent and abrasive in a manner to remove cobalt in an effective manner without excessive defects.

The slurry operates at a pH of 5 to 9 with an oxidation potential of the slurry sufficient to oxidize at least a portion of the $Co^0$ to $Co^{+3}$. Maintaining pH levels between 7 and 9 are advantageous for increasing cobalt removal rates, while keeping corrosion in control.

The slurry operates by balancing hydrogen peroxide oxidizing agent ($\alpha$), colloidal silica particles ($\beta$) and L-aspartic acid complexing agent ($\gamma$) in an unconventional manner. Conventional slurry operate at minimal abrasive levels that achieve acceptable removal rates. It is well known that limiting abrasive levels lead to lower defect levels. Unlike conventional slurries, this slurry increases oxidation and abrasive load to decrease polishing defects, while delivering high removal rates. Total concentrations remain within the following formulae as follows:

$$\text{wt }\%(\alpha)+\text{wt }\%(\beta)=1 \text{ to } 4 \text{ wt }\% \text{ for polishing the cobalt or cobalt alloy;}$$

$$\text{wt }\%(\gamma)\leq 2*\text{wt }\%(\alpha) \text{ for limiting static etch of the cobalt or cobalt alloy; and}$$

$$\text{wt }\%(\beta)+\text{wt }\%(\gamma)\leq 3*\text{wt }\%(\alpha) \text{ for limiting static etch of the cobalt or cobalt alloy.}$$

Preferably, maintaining the wt % ($\alpha$)+wt % ($\beta$)=1.5 to 3 wt % provides lower defects with an acceptable cobalt removal.

Preferably, the total concentrations remain within the following formulae as follows:

$$\text{wt }\%(\alpha)+\text{wt }\%(\beta)=1.5 \text{ to } 3 \text{ wt }\% \text{ for polishing the cobalt or cobalt alloy;}$$

$$\text{wt }\%(\gamma)\leq 1.5*\text{wt }\%(\alpha) \text{ for limiting static etch of the cobalt or cobalt alloy; and}$$

$$\text{wt }\%(\beta)+\text{wt }\%(\gamma)\leq 2.5*\text{wt }\%(\alpha) \text{ for limiting static etch of the cobalt or cobalt alloy.}$$

Most preferably, maintaining the wt % ($\alpha$)+wt % ($\beta$)=2 to 3 wt % provides lower defects with an acceptable cobalt removal.

Optionally, the slurry may contain buffers, dispersion agents, and surfactants.

The polishing composition can also optionally include buffering agents such as various organic and inorganic bases or their salts with a pKa in the pH range of greater than 5 to 9. The polishing composition can further optionally include defoaming agents, such as non-ionic surfactants including esters, ethylene oxides, alcohols, ethoxylate, silicon compounds, fluorine compounds, ethers, glycosides and their derivatives, and the like. The defoaming agent can also be an amphoteric surfactant. The polishing composition may optionally contain biocides, such as Kordex™ MLX (9.5-

9.9% methyl-4-isothiazolin-3-one, 89.1-89.5% water and ≤1.0% related reaction product) or Kathon™ ICP III containing active ingredients of 2-methyl-4-isothiazolin-3-one and 5-chloro-2-methyl-4-isothiazolin-3-one, each manufactured by The Dow Chemical Company, (Kathon and Kordex are trademarks of The Dow Chemical Company).

Preferably, the slurry polishes a semiconductor substrate by applying the slurry to a semiconductor substrate by placing 21 kPa or less downward force on a polishing pad. The downward force represents the force of the polishing pad against the semiconductor substrate. The polishing pad may have a circular shape, a belt shape or a web configuration. This low downward force is particularly useful for planarizing the semiconductor substrate to remove a barrier material from the semiconductor substrate. Most preferably, the polishing occurs with a downward force of less than or equal to 15 kPa.

EXAMPLES

Experimental Method

All the slurries in Table 1 used for polishing studies were prepared as mentioned in the following procedure. Complexing agents were added at desired concentrations to de-ionized water and mixed using an overhead stirrer (300-450 RPM) till they were completely dissolved, followed by pH adjustment to pH around 7.0 with dilute KOH solution (5 to 45%). Colloidal silica (Fuso SH-3-35 nm average diameter colloidal silica particles forming conjoined spheres having an average length of 70 nm) were added at specified wt % to the slurry while stirring with a final pH adjustment to 8.0 using KOH. Cleanroom grade $H_2O_2$ (30% solution) was added to achieve desired wt % of $H_2O_2$ concentration with stirring, 15 minutes prior to the polishing experiments.

TABLE 1

| Slurry Sample No. | Aspartic acid (wt %) | Colloidal silica (wt %) | $H_2O_2$ (wt %) | pH before $H_2O_2$ |
|---|---|---|---|---|
| 1 | 1.0 | 0.2 | 0.2 | 8 |
| 2 | 1.0 | 0.2 | 0.4 | 8 |
| 3 | 1.0 | 0.2 | 1.0 | 8 |
| 4 | 1.0 | 1.0 | 0.2 | 8 |
| 5 | 1.0 | 1.0 | 0.4 | 8 |
| 6 | 1.0 | 1.0 | 1.0 | 8 |
| 7 | 2.0 | 0.2 | 0.2 | 8 |
| 8 | 2.0 | 0.2 | 1.0 | 8 |
| 9 | 2.0 | 1.0 | 0.2 | 8 |
| 10 | 2.0 | 1.0 | 1.0 | 8 |
| 11 | 1.0 | 0 | 0.4 | 8 |
| 12 | 1.0 | 0.005 | 0.4 | 8 |
| 13 | 1.0 | 0.05 | 0.4 | 8 |
| 14 | 1.0 | 0.1 | 0.4 | 8 |
| 15 | 1.0 | 0.2 | 0.4 | 8 |
| 16 | 1.0 | 1.0 | 0.4 | 8 |
| 17 | 1.0 | 1.0 | 2.0 | 8 |
| 18 | 1.0 | 1.0 | 5.0 | 8 |
| 19 | 1.0 | 0.5 | 1.0 | 8 |
| 20 | 1.0 | 2.0 | 1.0 | 8 |
| 21 | 1.0 | 5.0 | 1.0 | 8 |

TABLE 2

| Polishing Tool | AMAT-MIRRA |
|---|---|
| Pad | IC1010-a polyurethane; Shore D hardness of 57, 30 and 60 μm average diameter closed cell pores and circular grooves having a depth, width and pitch of 760, 510 and 3,050 μm, respectively |
| Conditioner | Saesol 8031C1-170 μm diamond size; 40 μm diamond protrusion and 310 μm diamond spacing |
| Process | 2 PSI (13.8 kPa), 93/87 RPM, 200 ml/min (Downforce, Platen Speed/Carrier Speed, Slurry Flow Rate) |
| Post CMP clean | Synergy-ATMI PlanarClean™ Composition: Ethanolamine (1 to 10 wt %), Tetramethylammonium hydroxide (1 to 10 wt %), pH > 13.5 and dilution 1:20. |
| Polish Time | 10 to 60 sec |
| Wafers | Novati PVD cobalt~2000 Å thick-200 mm diameter |

The polished cobalt wafers were passed through a DSS-200 Synergy™ (OnTrak) double-sided wafer scrubber running ATMI PlanarClean chemistry, cobalt removal rates were measured with RS200 metal film thickness measurement tool by KLA Tencor, and defectivity was analyzed with SP2 laser inspection tool by KLA Tencor. Polishing results are in Table 3 that compares the cobalt removal rate, defects, and surface roughness after polishing the cobalt wafers.

TABLE 3

| Slurry Sample No. | Aspartic acid (wt %) | Colloidal silica (wt %) | $H_2O_2$ (wt %) | pH before $H_2O_2$ | Co RR (Å/min) | Defect counts | Co $R_a$ (Å) |
|---|---|---|---|---|---|---|---|
| 1 | 1.0 | 0.2 | 0.2 | 8 | 1964 | 29111 | 17 |
| 2 | 1.0 | 0.2 | 0.4 | 8 | 2480 | 7571 | 5 |
| 3 | 1.0 | 0.2 | 1.0 | 8 | 83 | 461 | 10 |
| 4 | 1.0 | 1.0 | 0.2 | 8 | 2115 | 63281 | 14 |
| 5 | 1.0 | 1.0 | 0.4 | 8 | 2699 | 9237 | 4 |
| 6 | 1.0 | 1.0 | 1.0 | 8 | 3187 | 2539 | 4 |
| 7 | 2.0 | 0.2 | 0.2 | 8 | 1687 | 29111 | 45 |
| 8 | 2.0 | 0.2 | 1.0 | 8 | 1114 | 4956 | 6 |
| 9 | 2.0 | 1.0 | 0.2 | 8 | 1767 | 38700 | 10 |
| 10 | 2.0 | 1.0 | 1.0 | 8 | 968 | 63519 | 4 |

RR = Removal Rate, $R_a$ = Surface Roughness

As seen from Table 3, there is a clear three way interaction between aspartic acid, colloidal silica, and $H_2O_2$ levels. Slurry No. 6 with 1 wt % aspartic acid, 1 wt % colloidal silica, and 1 wt % $H_2O_2$ delivers the highest cobalt removal rate while simultaneously delivering low surface roughness, and low defects.

Abrasives (Colloidal Silica) Levels:

The main function of abrasives is for mechanically driving the removal of 'softened' species on metal surfaces and for transporting slurry chemistry to the wafer and removing spent slurry from the wafer. Lowering the abrasives to 0.2 wt % shows beneficial effect of lowering the overall defects when compared to 1% abrasives at $H_2O_2$ levels at or below 0.4%, however at 1% $H_2O_2$ (1% aspartic acid), 0.2% abrasives delivers low Co RR, due to the passivation of cobalt as oxide/hydroxides that needs adequate mechanical abrasion to drive Co RR. Increasing the abrasives further to 1% with 1% $H_2O_2$ (1% aspartic acid slurry) provides higher Co RR. Lower abrasives provide lower defects, due to less chance of particle agglomeration and deposition on to cobalt wafers. However, it is surprising the higher abrasives at 1 wt % could deliver the lowest defect at optimum $H_2O_2$ (1 wt %) and aspartic acid (1 wt %) level.

Oxidizer ($H_2O_2$) Levels:

The main function of oxidizer such as $H_2O_2$ is to oxidize the metal surface and facilitate their removal. Optimum $H_2O_2$ level is critical to balance the oxidation and mechanical removal of cobalt in the presence of chelators. With the optimum level of aspartic acid (1 wt %) and abrasives (1 wt %) in the slurry, 1 wt % $H_2O_2$ deliver the lowest defect counts and highest Co removal rates. Another possible reason for low defects with higher $H_2O_2$, is the presence of $Co^{+3}$ oxides/hydroxides with 1 wt % $H_2O_2$ when compared to $Co^{+3}$ oxides/hydroxides at 0.4% $H_2O_2$ resulting in better chelation of $Co^{+3}$ vs. $Co^{+3}$ by aspartic acid and therefore lower chance of Co redeposition along with colloidal silica causing particle type and other defects.

Complexing Agent (Aspartic Acid) Levels:

The main function of complexing agents such as aspartic acid is to solubilize and chelate the oxidized metal ions and remove them from the wafer surface. From the polishing data in table 3, it can be seen that aspartic acid concentration also plays a critical role in Co RR, roughness, and defects. Addition of up to 2% aspartic acid, increases the chemical dissolution (etching) of cobalt, thereby disrupting the oxidation/chemical/mechanical removal, providing lower cobalt removal rates, and high surface roughness. Therefore, around 1 wt % aspartic acid is ideal to deliver high removal rates, low surface roughness and low defects.

TABLE 4

| Slurry Sample No. | Aspartic acid (wt %) | Colloidal Silica (wt %) | $H_2O_2$ (wt %) | pH before $H_2O_2$ | Co RR (Å/min) | Defect counts | Co Ra (Å) |
|---|---|---|---|---|---|---|---|
| 11 | 1.0 | 0 | 0.4 | 8 | 36 | 1080 | 5 |
| 12 | 1.0 | 0.005 | 0.4 | 8 | 49 | 365 | 11 |
| 13 | 1.0 | 0.05 | 0.4 | 8 | 1864 | 4948 | 4 |
| 14 | 1.0 | 0.1 | 0.4 | 8 | 2045 | 2636 | 5 |
| 15 | 1.0 | 0.2 | 0.4 | 8 | 2480 | 7571 | 5 |
| 16 | 1.0 | 1.0 | 0.4 | 8 | 2699 | 9237 | 4 |

RR = Removal Rate, $R_a$ = Surface Roughness

Table 4 shows that a minimum of 0.05 wt % colloidal silica is necessary to provide smooth polishing conditions.

TABLE 5

| Slurry Sample No. | Aspartic acid (wt %) | Colloidal Silica (wt %) | $H_2O_2$ (wt %) | pH before $H_2O_2$ | Co RR (Å/min) | Defect Count | Co Ra (Å) |
|---|---|---|---|---|---|---|---|
| 17 | 1.0 | 1.0 | 2.0 | 8 | 220 | 537 | 11 |
| 18 | 1.0 | 1.0 | 5.0 | 8 | 80 | 285 | 10 |
| 19 | 1.0 | 0.5 | 1.0 | 8 | 244 | 4948 | 9 |
| 20 | 1.0 | 2.0 | 1.0 | 8 | 3673 | 2636 | 5 |
| 21 | 1.0 | 5.0 | 1.0 | 8 | >8000 | N/A | N/A |

RR = Removal Rate, $R_a$ = Surface Roughness

Table 5 shows that excessive amounts of oxidizer lowers cobalt removal rate and increases surface roughness and increasing colloidal silica increases Co removal rate.

Introducing multiple complexing agents into a silica particle-containing test slurry first screened complexing agent for accelerating cobalt removal rate. A second removal rate evaluated hydrogen peroxide sensitivity by comparing removal rate at 0.4 and 1 percent hydrogen peroxide. The polishing occurred with the polishing conditions listed in Table 2 above. Table 6 below provides the removal rate and hydrogen peroxide sensitivity for multiple complexing agents.

TABLE 6

| Slurry Sample No. | Complexing Agent | M. Wt. (g/mol) | Complex. conc. (wt %) | Abrasive (1 wt %) | pH | Slope ΔCo RR/Δ%$H_2O_2$ (0.4 to 1%) | Co RR (Å/min) vs. wt % $H_2O_2$ 0% | 0.4% | 1.0% |
|---|---|---|---|---|---|---|---|---|---|
| 27 | None | — | — | K1501–50 | 8 | −750 | 191 | 539 | 90 |
| 28 | Citric acid | 192 | 0.5 | K1501–50 | 8 | — | — | 205 | — |
| 29 | Alanine | 89 | 0.9 | K1598-B25 | 8 | −6860 | — | 4673 | 540 |
| 30 | Serine | 105 | 0.8 | K1598-B25 | 8 | −5472 | — | 4030 | 749 |
| 31 | Proline | 115 | 0.86 | K1598-B25 | 8 | −469 | — | 756 | 475 |
| 32 | Picolinic acid | 123 | 0.92 | K1598-B25 | 8 | −295 | — | 1120 | 943 |
| 33 | Asparagine | 132 | 1.0 wt | K1598-B25 | 8 | −6523 | — | 4076 | 162 |
| 34 | L-Aspartic acid | 133 | 1.0 wt | K1598-B25 | 8 | −950 | — | 2987 | 2420 |
| 35 | Glutamic acid (GLU) | 147 | 0.74 | K1598-B25 | 8 | −3758 | — | 2403 | 148 |
| 36 | Histidine | 155 | 0.78 | K1598-B25 | 8 | −5842 | — | 3977 | 472 |
| 37 | Bicine | 163 | 0.41 | K1501–50 | 8 | −793 | — | 1091 | 615 |
| 38 | Nitrilotriacetic acid (NTA) | 191 | 0.96 | K1501–50 | 8 | −828 | — | 4476 | 3977 |
| 39 | Nitrilotriacetic acid (NTA) | 191 | 0.48 | K1501–50 | 8 | 1743 | — | 2842 | 1796 |
| 40 | Nitrilotriacetic acid (NTA) | 191 | 0.48 | K1598-B25 | 8 | — | — | 2909 | — |
| 41 | 1-hydroxyethane 1,1-diphosphonic acid (HEDP) | 206 | 0.51 | K1598-B25 | 8 | −445 | — | 622 | 355 |
| 42 | N(2hydroxyethyl) ethylenediamine-N,N',N'-triacetic acid (HEDTA) | 278.3 | 0.70 | K1598-B25 | 8 | −1438 | — | 2054 | 1191 |
| 43 | Nitrilotri (methylphosphonic acid) (NTMP) | 299 | 0.75 | K1501–50 | 8 | −459 | 187 | 1422 | 1147 |
| 44 | Ethylenediamine-N,N'-disuccinic acid trisodium (EDDS) | 358 | 0.90 | K1501–50 | 8 | −129 | 167 | 1384 | 1307 |
| 45 | 1,2Diaminocyclohexane tetraacetic acid Monohydrate (DCTA) | 364.4 | 0.91 | K1598-B25 | 8 | −12 | — | 71 | 64 |
| 46 | Ethylene glycol-bis (2aminoethylether)-N,N,N',N'-tetraacetic acid (EGTA) | 380.4 | 0.95 | K1598-B25 | 8 | −185 | — | 2083 | 1972 |
| 47 | Diethylenetriamine pentaacetic acid (DTPA) | 393 | 0.98 | K1598-B25 | 8 | 1445 | 207 | 677 | 1544 |

K1598-B25 = 35 nm average diameter colloidal silica; K1501-50 = 80 nm average diameter colloidal silica The removal rate slope, ΔCo RR/Δ wt % $H_2O_2$ was calculated as follows:

ΔCo RR/Δ wt % $H_2O_2$=(Co RR in Å/min at 0.4 wt % $H_2O_2$—Co RR in Å/min at 1.0 wt % $H_2O_2$)/ (0.4 wt %–1.0 wt %)RR=Removal Rate From the above, L-aspartic acid, nitrilotriacetic acid, nitrilotri(methylphosphonic acid), ethylenediamine-N,N'-disuccinic acid trisodium salt, and ethylene glycol-bis (2aminoethylether)-N,N,N',N'-tetraacetic acid all have sufficient removal cobalt rate in combination with good rate stability with change in $H_2O_2$ from 0.4 to 1.0 wt %. Alanine, serine, asparagine, glutamic acid and histidine all have hydrogen peroxide rate slope between 0.4 and 1.0 wt % hydrogen peroxide of in excess of 3700 or too high of a rate sensitivity for stable polishing performance at 1 wt % abrasives and pH 8. Most preferably, the complexing agent is L-aspartic acid.

The polishing slurry provides an unconventional combination of oxidizer, conjoined spherical silica particles and rate-stable complexing agent to provide a high rate slurry capable of polishing cobalt and cobalt-containing semiconductor features. It removes these features with lower defects by increasing oxidation of $Co^0$ to $Co^{+3}$ in combination with a higher particle load during polishing. Furthermore, the complexing agent has limited rated variation with the $Co^0$ to $Co^{+3}$ oxidation of the invention.

The invention claimed is:
1. A method for chemical mechanical polishing a semiconductor substrate having cobalt or cobalt alloy containing features containing $Co^0$ comprising the steps of:
mixing 0.4 to 1.0 wt % hydrogen peroxide oxidizing agent (α) into a slurry containing 0.5 to 3 wt % colloidal silica particles (β), the colloidal silica particles containing primary particles, the primary particles having an average diameter of 25 to 50 nm and linked together in conjoined spherical structures, the conjoined spherical structures having an average length of 40 to 80 nm, a cobalt corrosion inhibitor, 0.5 to 2 wt % complexing agent (γ) consists of L-aspartic acid, and balance water having a pH of 5 to 9 and wherein the total concentrations remain within the following formulae as follows:

wt %(α)+wt %(β)=1 to 4 wt % for polishing the cobalt or cobalt alloy;

wt %(γ)≤2*wt %(α) for limiting static etch of the cobalt or cobalt alloy; and wt %($\beta$)+wt %($\gamma$)≤3*wt %($\alpha$) for limiting static etch of the cobalt or cobalt alloy; and wherein slope of cobalt removal rate (Å/min) is from 0 to −1050 for a cobalt blanket wafer when increasing the hydrogen peroxide ($\alpha$) from 0.4 to 1.0 wt % when polishing with a polyurethane polishing pad having a Shore D hardness of 57, closed cell pores with an average diameter between 30 and 60 μm and circular grooves having a depth, width and pitch of 760, 510 and 3,050 μm, respectively at a downforce of 2 psi (13.8 kPa), 93 rpm platen speed, 87 rpm carrier speed with a slurry at 200 ml/min having 35 nm or 80 nm average diameter colloidal silica particles when using a diamond conditioner at a polish time of 10 to 60 seconds;

oxidizing at least a surface portion of the $Co^0$ to $Co^{+3}$ of the semiconductor substrate to prevent runaway dissolution of the $Co^0$ and to reduce polishing defects; and polishing the semiconductor substrate with a polishing pad to remove the surface portion of the semiconductor substrate oxidized to $Co^{+3}$.

2. The method of claim 1 wherein the wt % ($\alpha$)+wt % ($\beta$)=1.5 to 3.5 wt %.

3. The method of claim 1 wherein the pH is 7 to 9.

4. The method claim 1 wherein the pH is 5 to 7.

5. A method for chemical mechanical polishing a semiconductor substrate having cobalt or cobalt alloy containing features containing $Co^0$ comprising the steps of:

mixing 0.4 to 1.0 wt % hydrogen peroxide oxidizing agent ($\alpha$) into a slurry containing 0.75 to 2 wt % colloidal silica particles ($\beta$), the colloidal silica particles containing primary particles, the primary particles having an average diameter of 25 to 50 nm and linked together in conjoined spherical structures, the conjoined spherical structures having an average length of 40 to 80 nm, a cobalt corrosion inhibitor, 0.75 to 1.5 wt % complexing agent ($\gamma$) consists of L-aspartic acid, and balance water having a pH of 5 to 9 and wherein the total concentrations remain within the following formulae as follows:

wt %($\alpha$)+wt %($\beta$)=1.5 to 3 wt % for polishing the cobalt or cobalt alloy;

wt %($\gamma$)≤1.5*wt %($\alpha$) for limiting static etch of the cobalt or cobalt alloy; and wt %($\beta$)wt %($\gamma$)≤2.5*wt %($\alpha$) for limiting static etch of the cobalt or cobalt alloy;

and wherein slope of cobalt removal rate (Å/min) is from 0 to −1050 for a cobalt blanket wafer when increasing the hydrogen peroxide ($\alpha$) from 0.4 to 1.0 wt % when polishing with a polyurethane polishing pad having a Shore D hardness of 57, closed cell pores with an average diameter between 30 and 60 μm and circular grooves having a depth, width and pitch of 760, 510 and 3,050 μm, respectively at a downforce of 2 psi (13.8 kPa), 93 rpm platen speed, 87 rpm carrier speed with a slurry at 200 ml/min having 35 nm or 80 nm average diameter colloidal silica particles when using a diamond conditioner at a polish time of 10 to 60 seconds;

oxidizing at least a surface portion of the $Co^0$ to $Co^{+3}$ of the semiconductor substrate to prevent runaway dissolution of the $Co^0$ and to reduce polishing defects; and polishing the semiconductor substrate with a polishing pad to remove the surface portion of the semiconductor substrate oxidized to $Co^{+3}$.

6. The method of claim 5 wherein the wt % ($\alpha$)+wt % ($\beta$)=2 to 3 wt %.

7. The method of claim 5 wherein the pH is 7 to 9.

8. The method claim 5 wherein the pH is 5 to 7.

* * * * *